(12) United States Patent
Nishihara

(10) Patent No.: US 11,742,272 B2
(45) Date of Patent: Aug. 29, 2023

(54) SEMICONDUCTOR DEVICE

(71) Applicant: SHINKO ELECTRIC INDUSTRIES CO., LTD., Nagano (JP)

(72) Inventor: Yoichi Nishihara, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 139 days.

(21) Appl. No.: 17/456,612

(22) Filed: Nov. 26, 2021

(65) Prior Publication Data

US 2022/0208668 A1 Jun. 30, 2022

(30) Foreign Application Priority Data

Dec. 25, 2020 (JP) ................. 2020-217444

(51) Int. Cl.
*H01L 23/498* (2006.01)
*H01L 23/00* (2006.01)

(52) U.S. Cl.
CPC ........ H01L 23/49822 (2013.01); H01L 24/32 (2013.01); *H01L 2224/32225* (2013.01); *H01L 2924/3511* (2013.01)

(58) Field of Classification Search
CPC .. H01L 23/49822; H01L 23/498; H01L 24/32
See application file for complete search history.

(56) References Cited

U.S. PATENT DOCUMENTS

| | | | |
|---|---|---|---|
| 6,444,494 B1* | 9/2002 | Muramatsu | H01L 23/49833 257/E21.516 |
| 2003/0107110 A1 | 6/2003 | Ma | |
| 2005/0253244 A1 | 11/2005 | Chang | |
| 2007/0235810 A1 | 10/2007 | Delgado et al. | |

FOREIGN PATENT DOCUMENTS

| | | |
|---|---|---|
| JP | S56-070655 | 6/1981 |
| JP | 2019-114759 | 7/2019 |
| JP | 2020-155640 | 9/2020 |

OTHER PUBLICATIONS

Partial European search report dated May 20, 2022 with respect to the corresponding European patent application No. 21213256.7.

* cited by examiner

*Primary Examiner* — Jasmine J Clark
(74) *Attorney, Agent, or Firm* — IPUSA, PLLC

(57) ABSTRACT

A semiconductor device includes a film substrate, an adhesive on a first surface of the film substrate, an electronic component on the adhesive, a wiring layer on a second surface of the film substrate opposite from the first surface, and a reinforcement member in an area around the electronic component on the adhesive. The wiring layer is connected to the electronic component through a via hole piercing through the film substrate and the adhesive. The reinforcement member has a thickness smaller than the thickness of the electronic component.

6 Claims, 7 Drawing Sheets

SEMICONDUCTOR DEVICE

CROSS-REFERENCE TO RELATED APPLICATION

This application is based upon and claims priority to Japanese Patent Application No. 2020-217444, filed on Dec. 25, 2020, the entire contents of which are incorporated herein by reference.

FIELD

A certain aspect of the embodiment discussed herein is related to semiconductor devices.

BACKGROUND

According to semiconductor devices in which an electronic component such as a semiconductor element is mounted on a surface of a film substrate, a wiring layer is formed on the other surface of the film substrate. (See U.S. Pat. No. 8,049,338 and Japanese Laid-open Patent Publication Nos. 2020-155640 and 2019-114759.)

SUMMARY

According to an embodiment, a semiconductor device includes a film substrate, an adhesive on a first surface of the film substrate, an electronic component on the adhesive, a wiring layer on a second surface of the film substrate opposite from the first surface, and a reinforcement member in an area around the electronic component on the adhesive. The wiring layer is connected to the electronic component through a via hole piercing through the film substrate and the adhesive. The reinforcement member has a thickness smaller than the thickness of the electronic component.

Figure 1A:
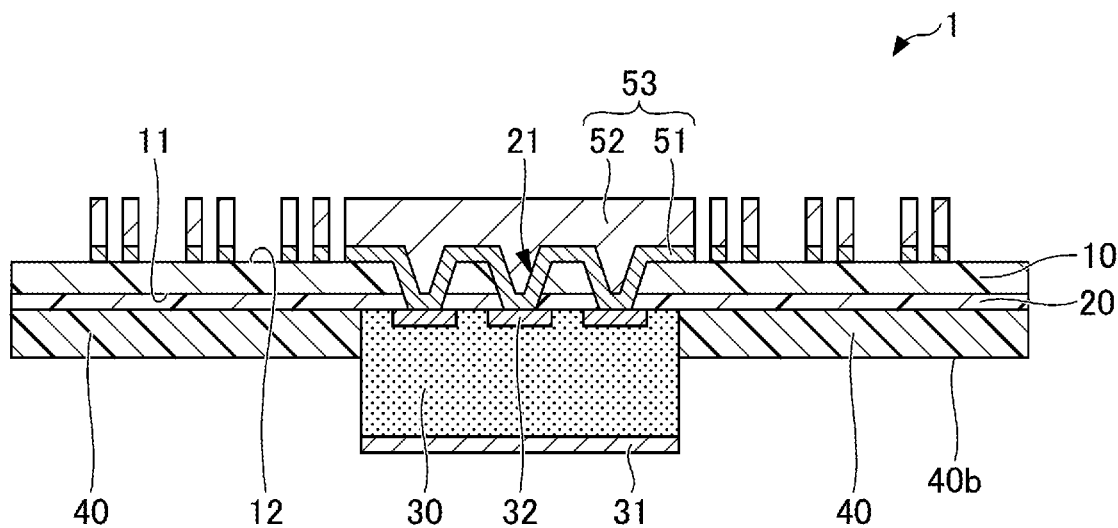
FIGS. 1A and 1B are diagrams illustrating a semiconductor device according to an embodiment.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENT

Semiconductor devices have a thin film substrate. Therefore, in an area where no electronic component is mounted (which may be hereinafter referred to as "non-mounting area"), the film substrate is low in stiffness and is likely to warp because of its own weight alone. The warp of the non-mounting area may apply an excessive stress to a conductive pattern to cause a crack in the conductive pattern.

According to an embodiment, a semiconductor device in which the warp of a film substrate is controlled and a method of manufacturing such a semiconductor device are provided.

An embodiment is described below with reference to the accompanying drawings. In the specification and drawings, components having substantially the same functional configuration are referred to using the same reference numeral, and a duplicate description thereof may be omitted. According to this disclosure, for convenience, the side of the film substrate of a semiconductor device on which side an electronic component is mounted is referred to as "first side" or "lower side", and the opposite side of the film substrate is referred to as "second side" or "upper side." Furthermore, a surface of the film substrate on which an electronic component is mounted is referred to as "first surface" or "lower surface", and the opposite surface of the film substrate is referred to as "second surface" or "upper surface." The semiconductor device, however, may be used in an inverted position or oriented at any angle.

Figure 1B:
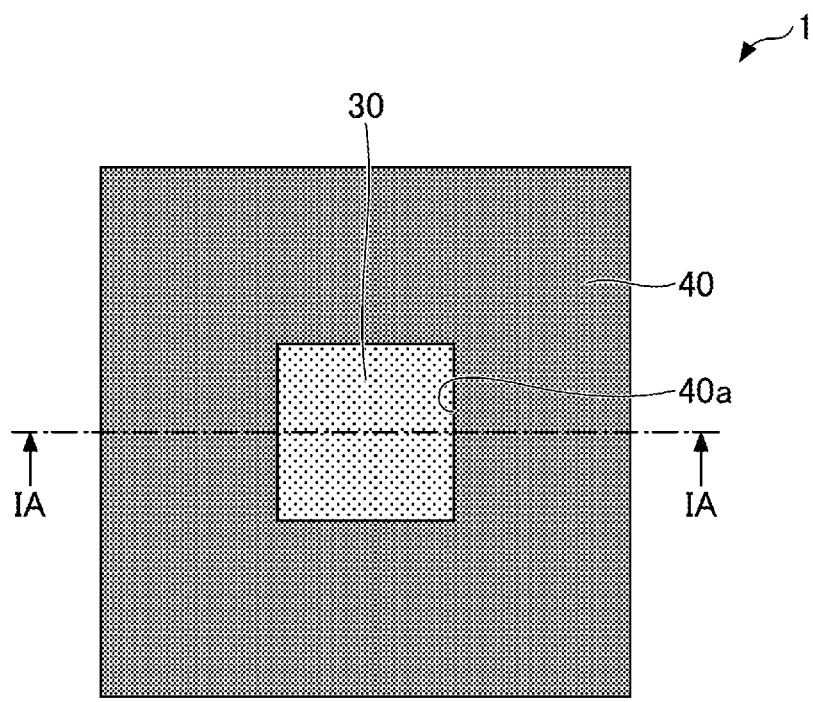

First, a semiconductor device structure is described. FIGS. 1A and 1B are diagrams illustrating a semiconductor device 1 according to the embodiment. FIG. 1A is a sectional view of the semiconductor device 1 taken along the line IA-IA of FIG. 1B. FIG. 1B is a lower side (bottom) view of the semiconductor device 1.

The semiconductor device 1 includes a film substrate 10, an adhesive 20, an electronic component 30, a reinforcement member 40 (an insulating layer), and a wiring layer 53. The adhesive 20 is provided on a first surface 11 of the film substrate 10. Examples of materials for the film substrate 10 include resins such as polyimide, epoxy, and acrylic resins. The thickness of the film substrate 10 is, for example, approximately 50 µm to approximately 100 µm. The material of the adhesive 20 is a thermosetting resin, and includes, for example, epoxy as a main component. A via hole 21 is formed in a laminate (layered structure) of the film substrate 10 and the adhesive 20. For example, the via hole 21 has an inverted truncated cone shape, tapering from the film substrate 10 side end to the adhesive 20 side end with an inclined lateral surface, so that the diameter of the via hole 21 is greater at the upper edge, or the film substrate 10 side end, than at the lower edge, or the adhesive 20 side end. Two or more via holes 21 may be famed. Hereinafter, one or more via holes 21 may be collectively referred to as "via hole 21."

The electronic component 30 is fixed to the film substrate 10 by the adhesive 20. Examples of the electronic component 30 include a semiconductor element (device) serving as an active element (for example, a silicon chip such as a central processing unit (CPU)), an insulated-gate bipolar transistor (IGBT), a metal-oxide-semiconductor field-effect transistor (MOSFET), and a diode. The electronic component 30 is a semiconductor element having electrodes provided on both the top side and the bottom side. According to this embodiment, an electrode 31 is provided on the first surface of the electronic component 30 and an electrode 32 is provided on the second surface of the electronic component 30. Two or more electrodes 32 may be provided. Hereinafter, one or more electrodes 32 may be collectively referred to as "electrode 32." The electrode 32 is so placed as to correspond to the via hole 21.

In addition to the electronic component 30, the reinforcement member 40 is fixed to the film substrate 10 by the adhesive 20. The reinforcement member 40 is, for example, an insulating film in which an opening 40a corresponding to the electronic component 30 is formed. In a plan view from a direction perpendicular to the first surface 11 of the film substrate 10 (hereinafter "plan view"), the reinforcement member 40 surrounds the electronic component 30. The outer edge of the reinforcement member 40 substantially coincides with the outer edge of the film substrate 10. The material of the reinforcement member 40 may be the same as the material of the film substrate 10. Examples of materials for the reinforcement member 40 include resins such as polyimide, epoxy, and acrylic resins. The thickness of the reinforcement member 40 may be equal to the thickness of the film substrate 10. The thickness of the reinforcement member 40 may be greater than the thickness of the film substrate 10. The thickness of the reinforcement member 40 is, for example, approximately 100 μm to approximately 150 μm. By using the same material for the film substrate 10 and the reinforcement member 40, it is possible to reduce warping due to thermal contraction or the like.

The thickness of the reinforcement member 40 is preferably smaller than the thickness (height) of the electronic component 30. According to the semiconductor device 1, for example, the electrode 31 is placed opposite a mounting substrate such as a wiring substrate and is soldered to a conductive pattern on the mounting substrate. Therefore, a lower surface 40b of the reinforcement member 40 is preferably positioned higher (closer to the wiring layer 53) than the lower surface of the electronic component 30. That is, the electronic component 30 preferably protrudes relative to the lower surface 40b of the reinforcement member 40.

The wiring layer 53 is formed (fills) in the via hole 21 and is formed on a second surface 12 of the film substrate 10. The wiring layer 53 includes a seed layer 51 and a plating layer 52 formed on the seed layer 51. The seed layer 51 and the plating layer 52 are, for example, copper layers. A surface treatment layer may be formed on a surface of the wiring layer 53. Examples of surface treatment layers include a gold (Au) layer, a nickel (Ni)/Au layer (a laminated metal layer of a Ni layer and a Au layer that are stacked in this order), and a Ni/palladium (Pd)/Au layer (a laminated metal layer of a Ni layer, a Pd layer, and a Au layer that are stacked in this order).

Figure 2:
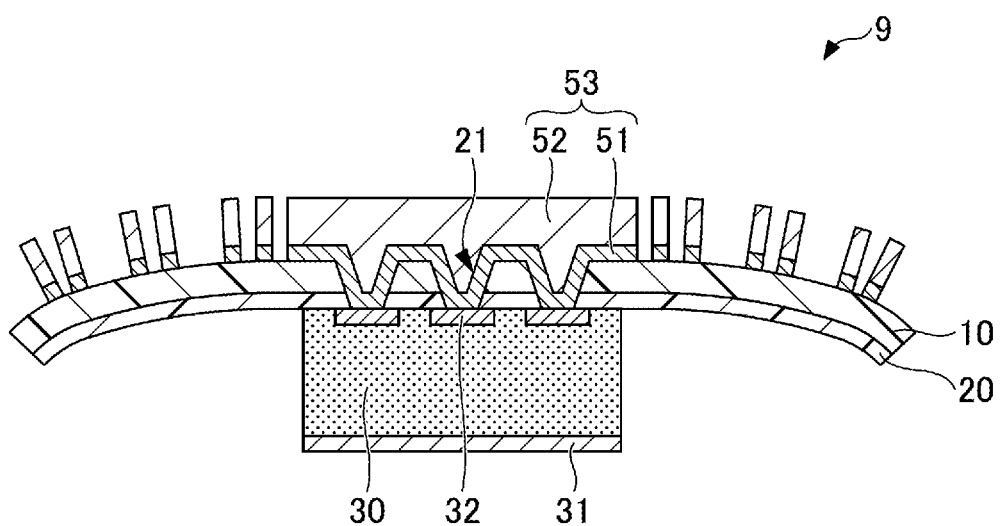
FIG. 2 is a sectional view of a semiconductor device according to a reference example.

Effects according to the semiconductor device 1 of this embodiment are described while making a comparison with a reference example. FIG. 2 is a sectional view of a semiconductor device 9 according to the reference example. The semiconductor device 9 has the same configuration as the semiconductor device 1 of this embodiment except that the reinforcement member 40 is not provided.

Compared with the semiconductor device 9, the semiconductor device 1 can have high stiffness because the reinforcement member 40 is provided. Therefore, while the semiconductor device 9 is likely to have a warp caused in a non-mounting region because of thermal contraction or the like as illustrated in FIG. 2, the semiconductor device 1 can control warping.

By controlling warping, it is possible to reduce or eliminate cracks in the wiring layer 53 to achieve high reliability. Furthermore, because warping is controlled, it is easy to align the semiconductor device 1 with high accuracy when mounting the semiconductor device 1 on a mounting substrate. Therefore, the semiconductor device 1 is easily usable with smaller mounting substrates. Furthermore, by controlling warping, it is possible to avoid unnecessary contact between an end of the semiconductor device 1 and a conductive pattern on a mounting substrate.

While the single wiring layer 53 is provided according to this embodiment, two or more wiring layers may be provided on the film substrate 10. That is, a multilayer wiring structure may be provided.

The reinforcement member 40 does not have to be in contact with the electronic component 30. In the plan view, there may be a gap between the reinforcement member 40 and the electronic component 30.

Next, a method of manufacturing the semiconductor device 1 according to this embodiment is described. FIGS. 3A through 3K are sectional views illustrating a method of manufacturing the semiconductor device 1 according to this embodiment.

Figure 3A:
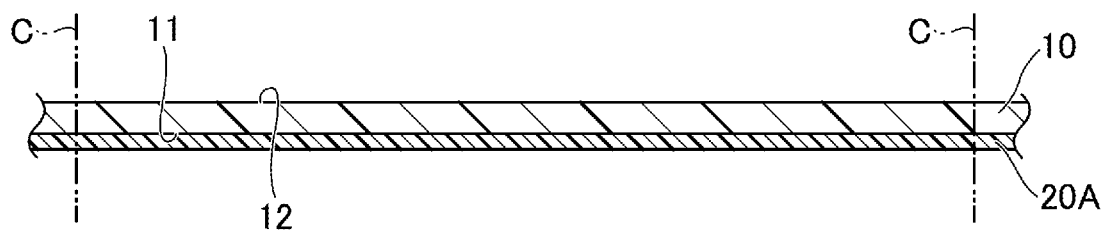
FIGS. 3A through 3K are sectional views illustrating a method of manufacturing a semiconductor device according to the embodiment.

First, as illustrated in FIG. 3A, the film substrate 10 is prepared. The size of the film substrate 10 prepared here is a large size corresponding to multiple semiconductor devices 1, and this film substrate 10 is ultimately cut along cutting lines C to be divided into individual pieces. Next, an uncured adhesive 20A is provided on the first surface 11 of the film substrate 10. The adhesive 20A may be provided by, for example, spin coating. A film adhesive may be applied as the adhesive 20A.

Figure 3B:
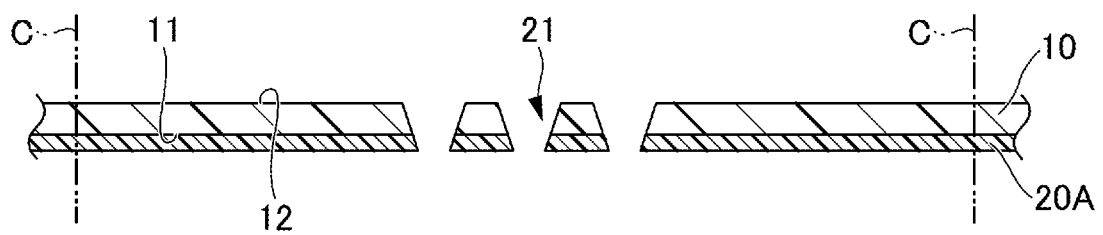

Next, as illustrated in FIG. 3B, the via hole 21 is famed in a laminate of the film substrate 10 and the adhesive 20A. The via hole 21 may be formed by, for example, emitting a laser beam onto the laminate from the film substrate 10 side.

Figure 3C:
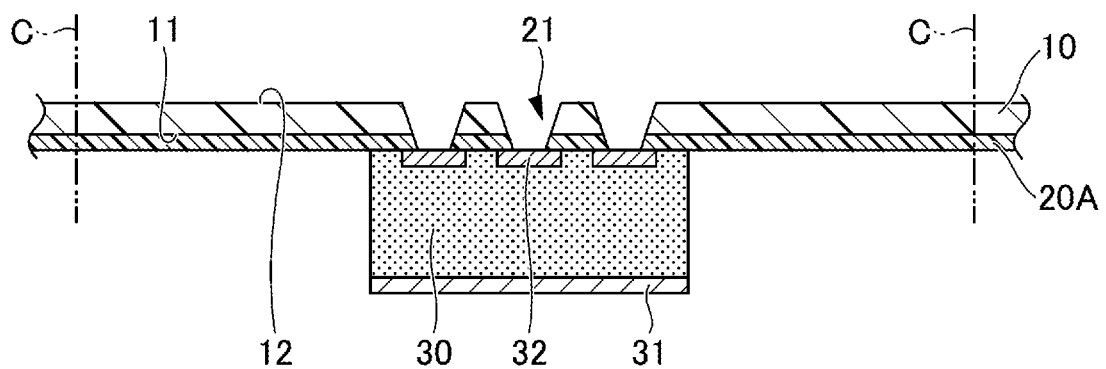

Next, as illustrated in FIG. 3C, the electronic component 30 is attached to the adhesive 20A. The electronic component 30 has the electrode 31 on the first surface and the electrode 32 on the second surface. In attaching the electronic component 30, the electrode 32 is aligned with the via hole 21.

Figure 3D:
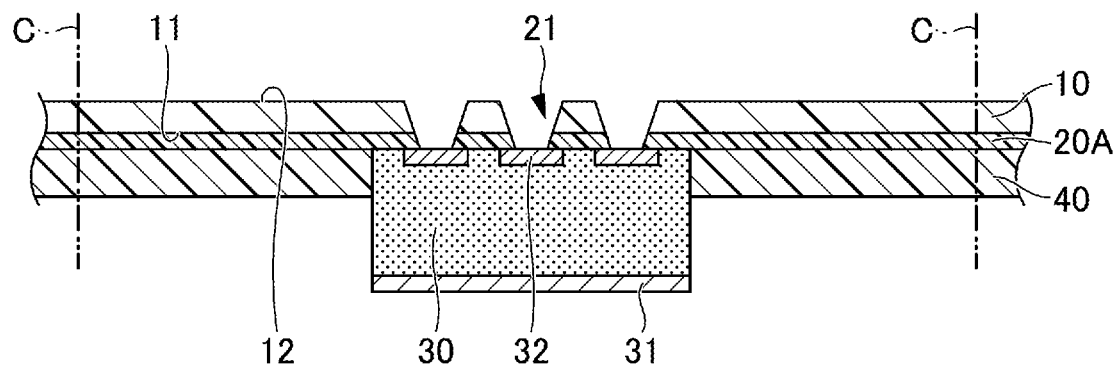

Next, as illustrated in FIG. 3D, the insulating reinforcement member 40 is attached to the adhesive 20A in an area around the electronic component 30. The reinforcement member 40 is, for example, an insulating film in which an opening corresponding to the electronic component 30 is famed.

Figure 3E:
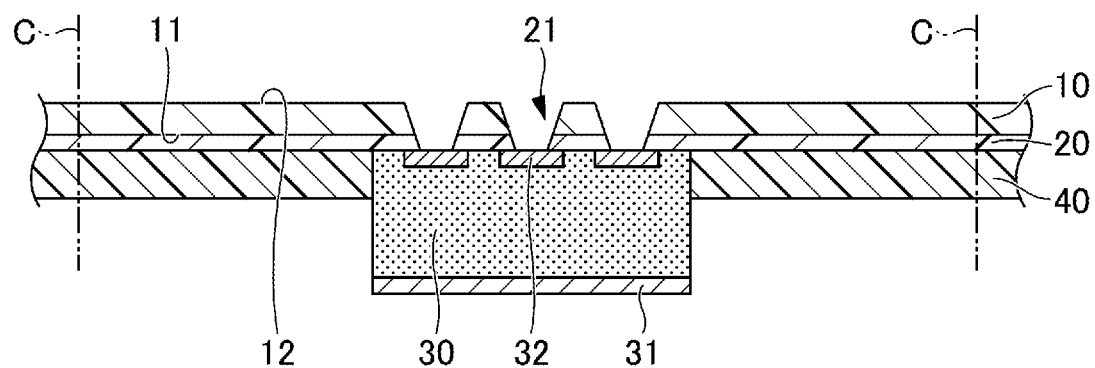

Next, as illustrated in FIG. 3E, by performing pressure baking on the structure illustrated in FIG. 3D, the cured adhesive 20 is obtained from the adhesive 20A. The adhesive 20A cures to firmly fix the electronic component 30 and the reinforcement member 40 to the film substrate 10.

Figure 3F:
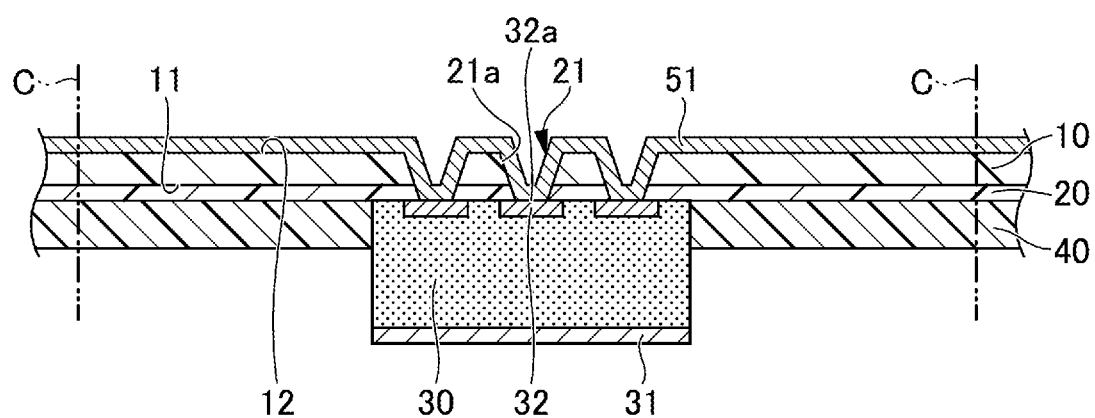

Next, as illustrated in FIG. 3F, the seed layer 51 is formed on the second surface 12 of the film substrate 10, a surface of the laminate defining the side of the via hole 21 (a side surface 21a of the via hole 21), and a surface 32a of the electrode 32 of the electronic component 30 exposed in the via hole 21. The seed layer 51 may be formed by, for example, sputtering.

Figure 3G:
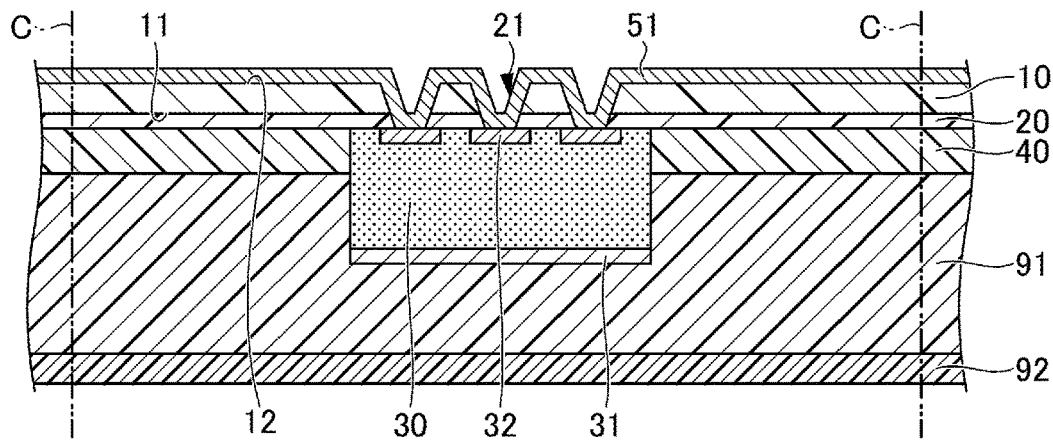

Next, as illustrated in FIG. 3G, a spacer 91 contacting the lower surface of the reinforcement member 40 is placed in an area around the electronic component 30. The spacer 91 may be a recess structure that can accommodate the electronic component 30, or may be a laminate of multiple spacers. Examples of materials for the spacer 91 include resins such as polyimide, epoxy, and acrylic resins. Resin and metal may be used alone or in combination as the material of the spacer 91. The same insulating film as used as the reinforcement member 40 may be used as the spacer 91.

Furthermore, a protective film 92 is placed under the spacer 91. Examples of materials for the protective film 92 include polyimide, polyolefin, and polyvinyl chloride.

Figure 3H:
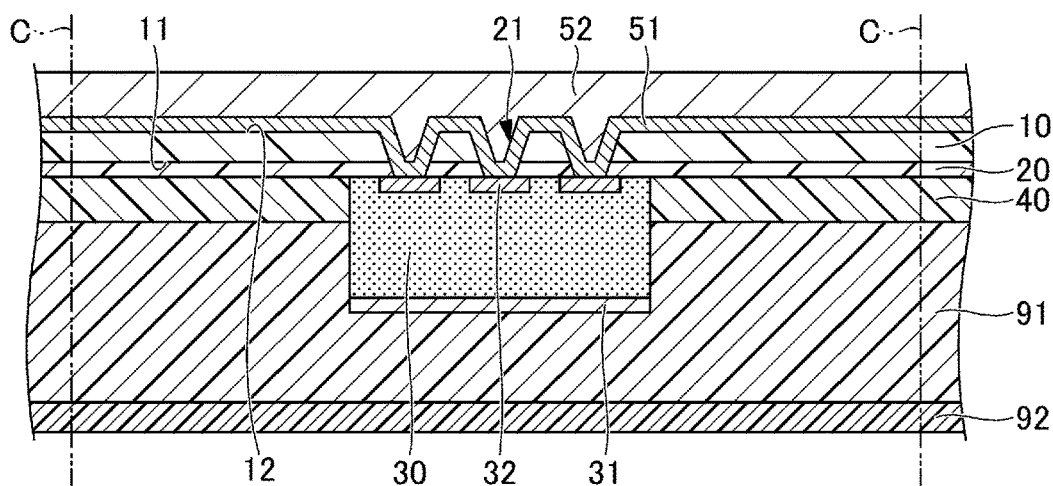

Next, as illustrated in FIG. 3H, by performing copper electroplating using the seed layer 51 as a power feed path, the plating layer 52 is formed on the seed layer 51. At this point, because the spacer 91 and the protective film 92 are provided under the film substrate 10, the electronic component 30 including the electrode 31 is protected from an electrolyte.

Figure 3I:
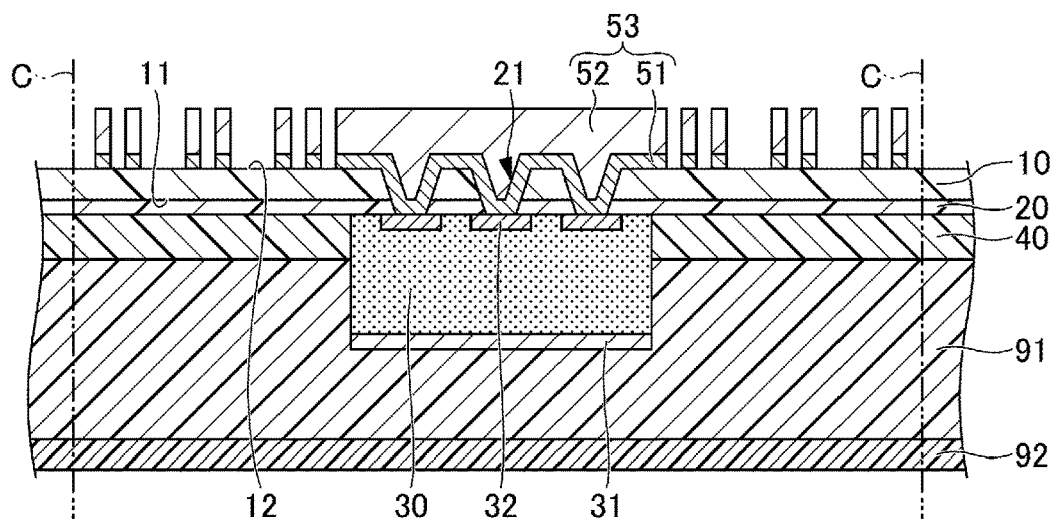

Next, a resist layer (not depicted) in which a wiring pattern is formed is formed on the plating layer 52. A dry film resist or the like may be used as the resist layer. The resist layer may be exposed to light and developed to have a wiring pattern formed in the resist layer. Next, the plating layer 52 and the seed layer 51 are etched using the resist layer as a mask. As a result, as illustrated in FIG. 3I, the wiring layer 53 is obtained from the plating layer 52 and the seed layer 51. Thus, the wiring layer 53 may be formed by, for example, a semi-additive process. A surface treatment layer may be formed on the wiring layer 53. Other plating may be performed on the wiring layer 53. During etching and plating as well, the electronic component 30 is protected by the spacer 91 and the protective film 92.

Figure 3J:
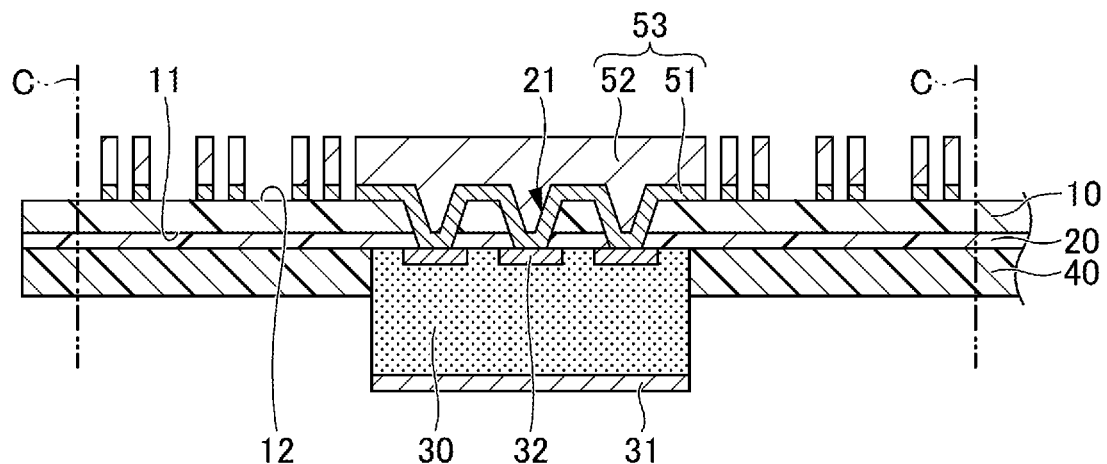

Next, as illustrated in FIG. 3J, the spacer 91 and the protective film 92 are removed.

Figure 3K:
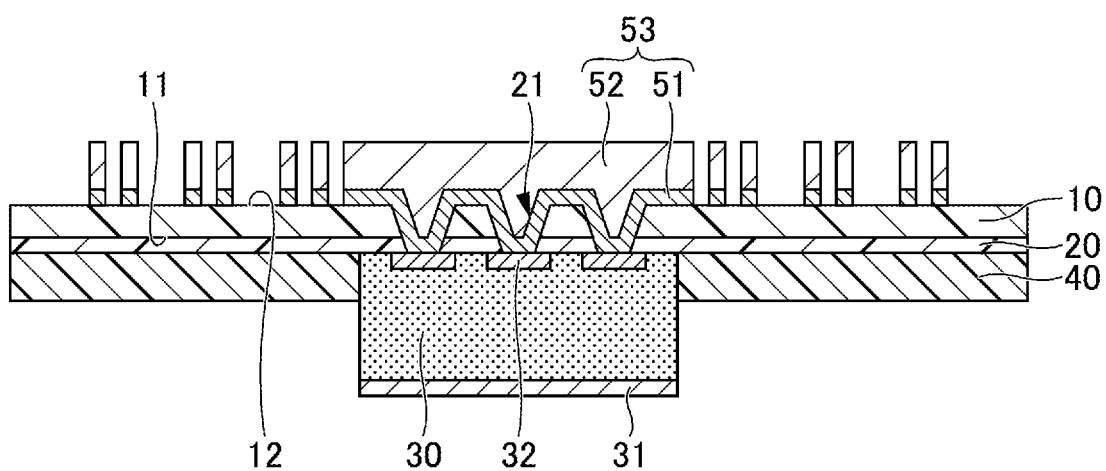

Next, the structure illustrated in FIG. 3J is cut along the cutting lines C into individual pieces. As a result, as illustrated in FIG. 3K, the semiconductor device 1 is obtained. While the single semiconductor device 1 is depicted in FIG. 3K, multiple semiconductor devices 1 are obtained from the structure illustrated in FIG. 3J.

Figure 4A:
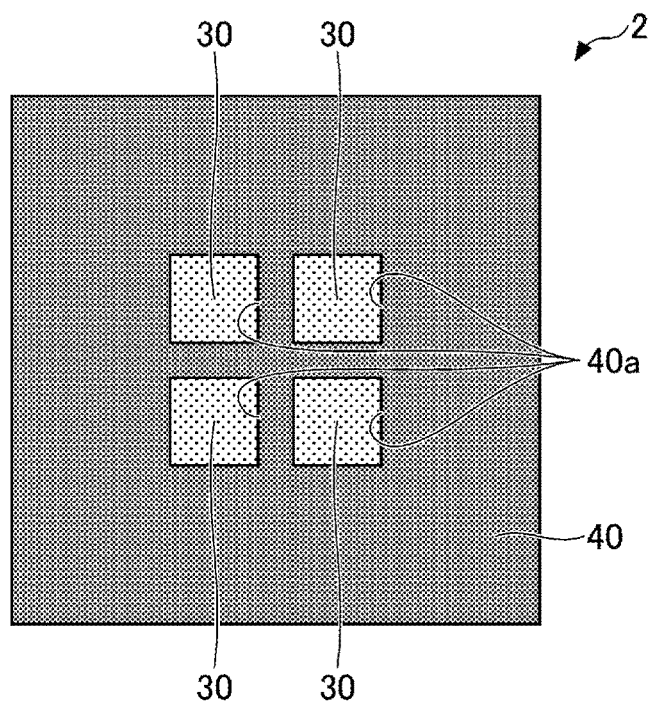
FIGS. 4A and 4B are lower side views of semiconductor devices according to variations of the embodiment.
Figure 4B:
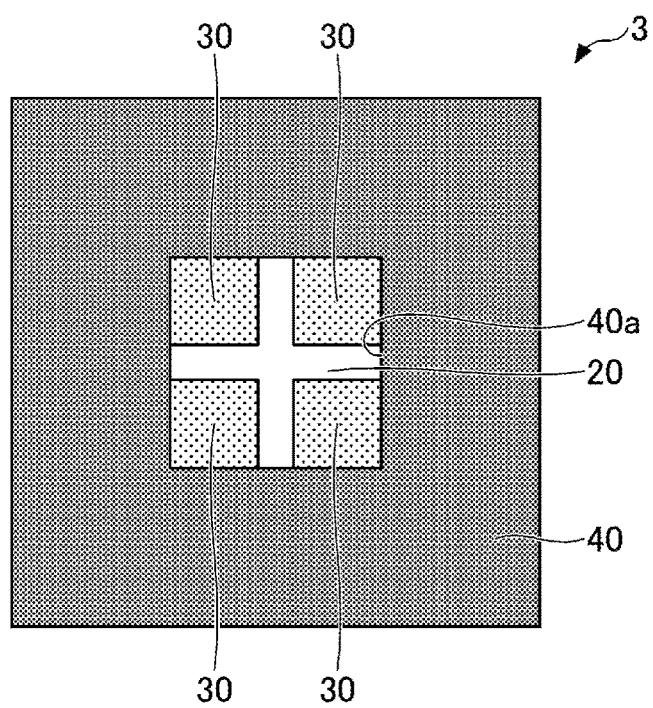

Multiple electronic components 30 may be provided on the first surface 11 of the film substrate 10. FIGS. 4A and 4B are lower side (bottom) views of semiconductor devices according to variations of the embodiment.

According to a semiconductor device 2 of a first variation illustrated in FIG. 4A, four electronic components 30 are arranged in a matrix in the substantial center of the first surface 11 of the film substrate 10. In the plan view, the reinforcement member 40 is so provided as to surround the four electronic components 30. Furthermore, the reinforcement member 40 is also provided between adjacent electronic components 30. In this case, four openings 40a corresponding to the four electronic components 30 are formed in the reinforcement member 40.

According to a semiconductor device 3 of a second variation illustrated in FIG. 4B, four electronic components 30 are arranged in a matrix in the substantial center of the first surface 11 of the film substrate 10. In the plan view, the reinforcement member 40 is so provided as to surround the four electronic components 30, and the adhesive 20 is exposed between adjacent electronic components 30.

According to these semiconductor devices 2 and 3 as well, the same effects as produced according to the semiconductor device 1 of the embodiment can be produced.

According to an embodiment, it is possible to control the warping of the film substrate of a semiconductor device.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention are described in detail, it should be understood that various changes, substitutions, and alterations could be made hereto without departing from the spirit and scope of the invention.

Various aspects of the subject matter described herein may be set out non-exhaustively in the following numbered clauses:

1. A method of manufacturing a semiconductor device, the method including:
   forming a via hole through a film substrate and an adhesive on a first surface of the film substrate;
   providing an electronic component on the adhesive;
   providing a reinforcement member in an area around the electronic component on the adhesive, the reinforcement member having a thickness smaller than a thickness of the electronic component; and
   forming a wiring layer on a second surface of the film substrate opposite from the first surface such that the wiring layer is connected to the electronic component through the via hole.

2. The method of clause 1, wherein forming the wiring layer includes
   placing a spacer contacting the reinforcement member in an area around the electronic component;
   forming a seed layer on the second surface of the film substrate, a side surface of the via hole, and a surface of an electrode of the electronic component exposed in the via hole, after said placing the spacer;
   forming a plating layer on the seed layer;
   etching the plating layer and the seed layer; and
   removing the spacer after said etching the plating layer and the seed layer.

What is claimed is:

1. A semiconductor device comprising:
   a film substrate;
   an adhesive on a first surface of the film substrate;
   an electronic component on the adhesive;
   a wiring layer on a second surface of the film substrate opposite from the first surface, the wiring layer being connected to the electronic component through a via hole piercing through the film substrate and the adhesive; and
   a reinforcement member in an area around the electronic component on the adhesive, the reinforcement member having a thickness smaller than a thickness of the electronic component.

2. The semiconductor device as claimed in claim 1, wherein a material of the reinforcement member is same as a material of the film substrate.

3. The semiconductor device as claimed in claim 1, wherein the thickness of the reinforcement member is greater than or equal to a thickness of the film substrate.

4. The semiconductor device as claimed in claim 1, wherein the reinforcement member surrounds the electronic component in a plan view from a direction perpendicular to the first surface.

5. The semiconductor device as claimed in claim 1, wherein
   the electronic component includes a plurality of electronic components on the adhesive, and
   the reinforcement member surrounds the plurality of electronic components in a plan view from a direction perpendicular to the first surface.

6. A semiconductor device comprising:
   a film substrate;
   an adhesive layer on a first surface of the film substrate;
   an insulating layer on the adhesive layer;
   an electronic component attached to the adhesive layer through an opening in the insulating layer, the electronic component protruding relative to a surface of the insulating layer facing away from the adhesive layer; and
   a wiring layer on a second surface of the film substrate opposite from the first surface, the wiring layer being electrically connected to the electronic component.

* * * * *